United States Patent [19]
Oskotsky

[11] Patent Number: 5,724,122
[45] Date of Patent: Mar. 3, 1998

[54] ILLUMINATION SYSTEM HAVING SPATIALLY SEPARATE VERTICAL AND HORIZONTAL IMAGE PLANES FOR USE IN PHOTOLITHOGRAPHY

[75] Inventor: Mark L. Oskotsky, Mamaroneck, N.Y.

[73] Assignee: SVG Lithography Systems, Inc., Wilton, Conn.

[21] Appl. No.: 448,994

[22] Filed: May 24, 1995

[51] Int. Cl.[6] ........................................ G03F 7/20
[52] U.S. Cl. ........................ 285/67; 355/53; 354/713
[58] Field of Search ........................ 355/67, 71, 53; 359/710, 712, 713, 714

[56] References Cited

U.S. PATENT DOCUMENTS

| | | | |
|---|---|---|---|
| 4,516,832 | 5/1985 | Jain et al. | 350/96.24 |
| 4,619,508 | 10/1986 | Shibuya et al. | 353/122 |
| 4,682,885 | 7/1987 | Torigoe . | |
| 4,851,882 | 7/1989 | Takahashi et al. . | |
| 4,918,583 | 4/1990 | Kudo et al. | 362/268 |
| 4,939,630 | 7/1990 | Kikuchi et al. | 362/268 |
| 5,121,160 | 6/1992 | Sano et al. . | |
| 5,237,367 | 8/1993 | Kudo | 355/67 |
| 5,245,384 | 9/1993 | Mori | 355/67 |
| 5,296,892 | 3/1994 | Mori | 355/67 |
| 5,300,971 | 4/1994 | Kudo | 355/67 |
| 5,320,918 | 6/1994 | Raab et al. | 430/4 |

FOREIGN PATENT DOCUMENTS 0 668 541 A1  8/1995  European Pat. Off. .

Primary Examiner—Joan H. Pendegrass
Attorney, Agent, or Firm—Fattibene and Fattibene; Paul A. Fattibene; Arthur T. Fattibene

[57] ABSTRACT

An illumination system having spatially separate horizontal and vertical intermediate image planes. A beam expander is used to expand a laser beam and direct the light to a lens array. A condenser projects and concentrates the light from the lens array into a spatially separate vertical and horizontal intermediate image planes. A relay re-images the spatially separate vertical and horizontal intermediate image planes at a single plane at a reticle. The image of the reticle is thereby projected onto a wafer. Width adjusting means and height adjusting means are located at the respective horizontal and vertical intermediate image planes. The zoomable beam expander is used to change the partial coherence independently in both planes without loss of light. The changeable lens array is used to independently change the two-dimensions of the field of view of the illumination system without loss of light. The physically separate horizontal and vertical intermediate image planes permits facilitating control over the vertical height and horizontal width of the desired rectangular illumination. The rectangular illumination is used to scan a reticle for projection onto a wafer as required in scanning type photolithography in the manufacture of circuits.

29 Claims, 3 Drawing Sheets

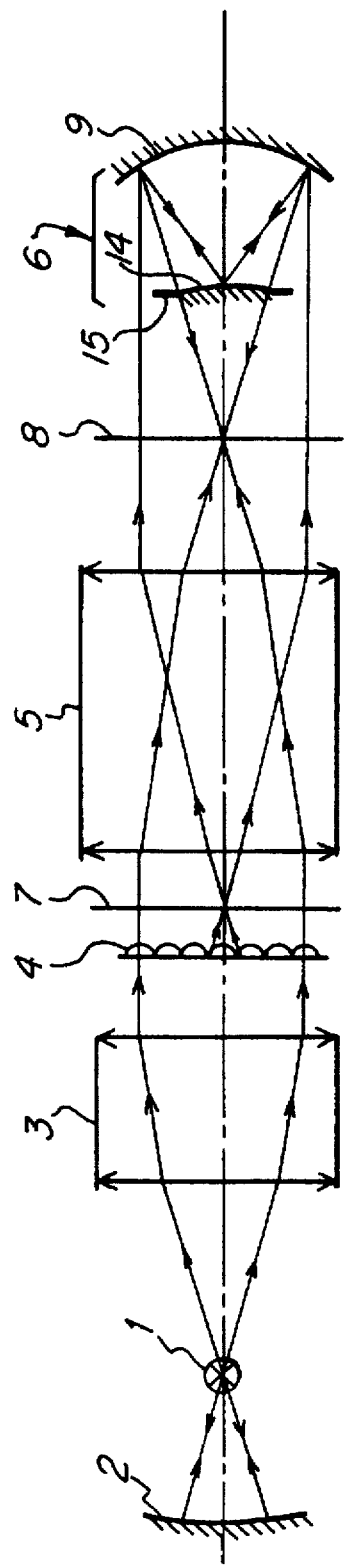
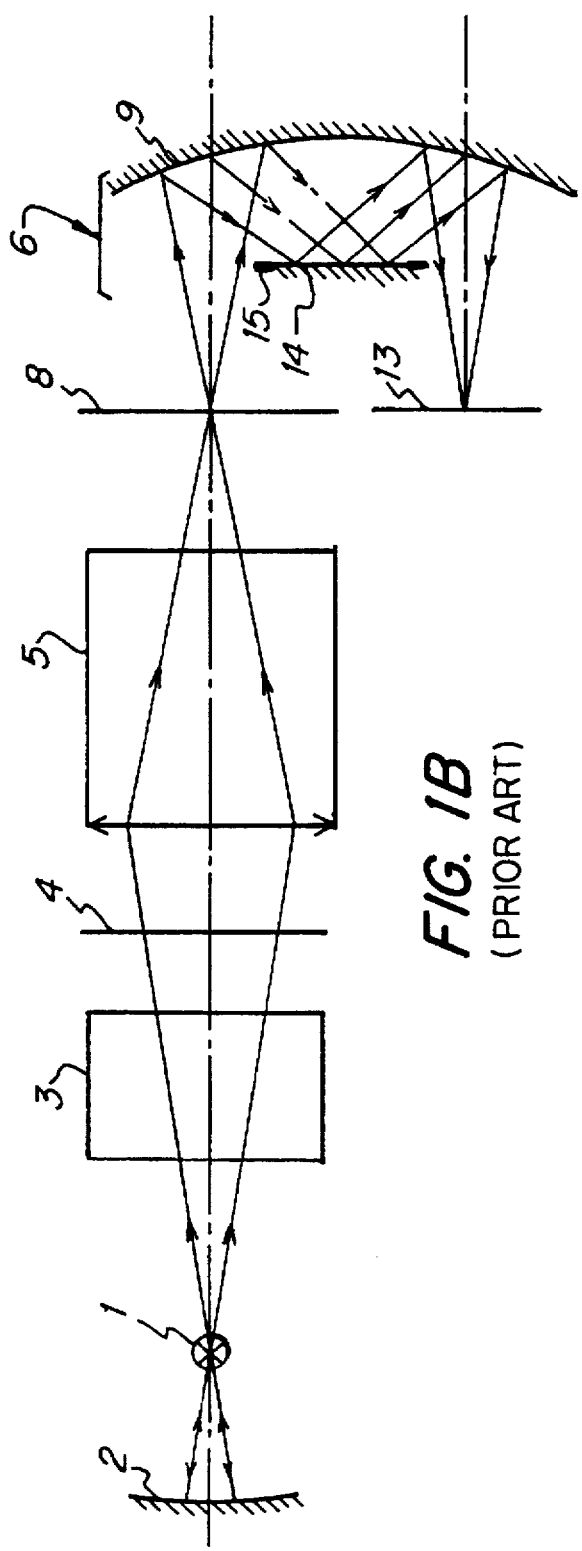
FIG. 1A (PRIOR ART)
FIG. 1B (PRIOR ART)

ILLUMINATION SYSTEM HAVING SPATIALLY SEPARATE VERTICAL AND HORIZONTAL IMAGE PLANES FOR USE IN PHOTOLITHOGRAPHY

FIELD OF THE INVENTION

The invention relates to illumination systems and methods useful in photolithography. Specifically, the invention relates to illumination systems adaptable to different projection optical systems and employing spatially separate intermediate image planes.

BACKGROUND OF THE INVENTION

In the process of semiconductor manufacturing, photolithography is typically used to project light through a reticle exposing a silicon wafer coated with photosensitive resist in select regions to define circuit elements. An illumination system is used in photolithography for illuminating and concentrating light at the reticle. One example of an illumination system is described in U.S. Pat. No. 4,516,832 issuing to Jain et al on May 14, 1985 and entitled "Apparatus for Transforming of a Collimated Beam into a Source of Required Shape and Numerical Aperture." Jain et al describes a laser light source and a transforming optical apparatus for transforming the light source into a self-luminous curved line source. Another type of illumination system is described in U.S. Pat. No. 4,619,508 issuing to Shibuya et al on Oct. 28, 1986 and entitled "Illumination Optical Arrangement." Shibuya describes an illumination system with a coherent light source and means for forming a substantially incoherent light source therefrom. Still another illumination system is described in U.S. Pat. No. 4,918,583 issuing to Kudo et al on Apr. 17, 1990 and entitled "Illuminating Optical Device." Kudo describes an illumination system with a reflective type integrator and a fly-eye type integrator.

Another illumination system has been used in step-and-scan photolithography equipment sold under the trademark Micrascan II by SVG Lithography Systems, Inc. Wilton, Conn. In this equipment, the reticle and the wafer move with different speeds. The different speeds having a ratio equal to the magnification of the projection optics. A rectangular field defined by the illumination system is scanned over the reticle and over the wafer. A vertical field delimiter frames the vertical field height, and horizontal framing blades frame the horizontal field width. To obtain uniformity exposure from the top to bottom of the exposed field, an adjustable slit is required.

As shown in Figure FIG. 1A, the meridional plane, and FIG. 1B, the sagittal plane, the Micrascan II illumination system includes a high pressure xenon-mercury lamp 1, a reflector 2, a cylindrical condenser 3, a cylindrical lens array 4, a sphero-cylindrical condenser 5, and a 1x relay 6. In the vertical plane the reflector 2 directs light from the lamp 1 onto the cylindrical condenser 3 which collimates the light and directs it onto the lens array 4. The lens array 4 represents a variety of small positive lenses with the same focal length and f-number and produces a multiple point source in its focal plane 7. In the vertical plane light from each of the point sources passes through the sphero-cylindrical condenser 5 and illuminates each point of an intermediate image plane 8. The lens array 4 focal plane is imaged to infinity, so that there is Koehler-type illumination. By Koehler-type illumination is meant a two stage illumination system whereby the area of illumination and the numerical aperture of the illuminating beam can be controlled.

In the horizontal plane, the arc of lamp 1 is imaged by the sphero-cylindrical condenser 5 onto the intermediate image plane 8. A telecentric pattern of light exists at the intermediate image plane 8. The 1x relay 6 consisting of two concentric mirrors 9 and 11 images the intermediate image plane 8 onto the reticle 13, and the focal plane 7 of the lens array 4 onto the aperture stop 15 which is located at a secondary mirror 11. It is possible to change partial coherence, optical resolution, and depth of focus of the illumination system by placing different kinds of diaphragms, including the annular and quadrupole type, and phase shifting masks at the aperture stop 15. Because of the 1x magnification of the lens relay 6, a telecentric pattern of light exists at the reticle 13.

The Micrascan II illumination system only has a single intermediate image plane 8. The vertical field delimiter is located at the intermediate image plane 8 defining the height of the illumination field at the reticle 13. The horizontal framing blades are located near the reticle 13. As a result the image at the wafer of the horizontal framing blades is not sharp. This prevents efficient use of wafer area. The ratios between the intermediate image 8 and the lens array 4 vertical and horizontal sizes are 0.7 and 0.4 correspondingly. The partial coherence and the field size of the Micrascan II illumination system cannot be changed without loss of light. Lose of light decreases throughput. The overall length of the Micrascan II illumination system from the lamp 1 to the reticle 13 is about 2,500 mm.

In general, the illumination of a reticle must be sufficiently uniform to evenly expose the photosensitive resist coating the wafer. In addition, the illumination must be of a predetermined field size in the vertical and horizontal dimensions, however, these dimensions vary in different photolithography processes. However, independently changing the vertical field height and/or horizontal field width of an illumination system for different photolithography processes is often difficult without loss of light. Further, it is desirable that the numerical aperture of the illumination system match that of the projection optics. Additionally, the changing of the partial coherence of the illumination as required in different applications cannot be accomplished without loss of light, therefore increasing the required exposure time and as a result reducing throughput. Therefore, there is a need for an illumination system which is easily adaptable to different photolithography systems and processes which permits a change in the partial coherence, and a change in the illumination field size in two dimensions independently with out loss of light, while permitting sharp imaging of the vertical field delimiter and horizontal framing blades at the wafer.

SUMMARY OF THE INVENTION

The present invention relates to an illumination system that is adaptable to different projection optical systems and has a spatially separate intermediate image plane for a horizontal and vertical field. In one embodiment, the present invention includes a radiation, e.g., light source, a zoom beam expander followed by a changeable lens array, a sphero-cylindrical condenser having two spatially separate intermediate image planes in a horizontal and a vertical plane, means for independently adjusting the field size at the vertical and horizontal image planes, and an afocal sphero-cylindrical relay conjugating the vertical and horizontal intermediate image planes to the reticle.

Accordingly, it is an object of the present invention to uniformly illuminate a reticle for projection onto a substrate.

It is another object of the present invention to provide an illumination system facilitating adjustment of partial coherence without loss of light.

It is yet another object of the present invention to provide for independently changing of the vertical and horizontal field size without the loss of light.

It is a another feature of the present invention that Koehler-type illumination is provided in both the sagittal and the meridional planes.

It is another feature of the present invention that two spatially separate vertical and horizontal intermediate image planes are formed.

It is yet another feature of the present invention that a zoom beam expander is used.

These and other objects, advantages, and features will become readily apparent in view of the following detailed description.

BRIEF DESCRIPTION OF THE DRAWINGS

FIG. 1A is a schematic illustration of the meridional plane of a prior illumination system.

FIG. 1B is a schematic illustration of the sagittal plane of a prior illumination system.

DETAILED DESCRIPTION OF THE PREFERRED EMBODIMENTS

Figure 2:
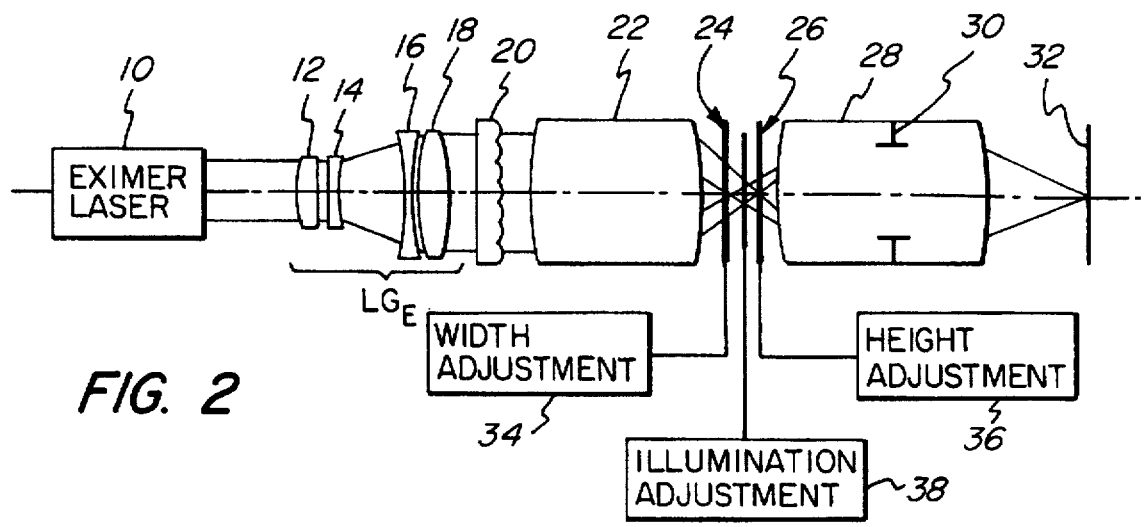
FIG. 2 is a schematic illustration of an embodiment of the optical illumination system of the present invention.

FIG. 2 is a schematic diagram illustrating one embodiment of the optical illumination system of the present invention. An excimer laser 10 is preferably used as an illumination or light source. Relatively stable excimer lasers suitable for photolithography can be purchased from Cymer of San Diego, Calif. or Lambda Psysic of Acton, Mass.

The laser 10 directs light into a zoom beam expander $LG_E$, comprising in one embodiment, a lens group of a positive lens 12, a negative lens 14, a negative lens 16, and a positive lens 18. Other configurations of lenses may be used as long as the lens group performs the function of a zoom beam expander. The zoom beam expander $LG_E$ can change the expansion of the beam emitted from the laser 10 and maintain the beam in a substantially collimated shape. The zoom beam expander $LG_E$ may contain spherical and/or cylindrical elements. This permits the emitted beam shape to be changed. A lens array 20 follows or is placed adjacent the zoom beam expander $LG_E$. The lens array 20 can be a microlens array, but also may be a conventional fly's eye array, binary lens array, or diffraction grating array. Following or adjacent the lens array 20 is a condenser 22. The condenser 22 is preferably a sphero-cylindrical condenser. The condenser 22 has a spatially separate horizontal image plane 24 and a vertical image plane 26. The light at the horizontal image plane 24 and the vertical image plane 26 is telecentric and therefore images the focal plane of the lens array 20 to infinity. The numerical apertures at the respective horizontal and vertical intermediate image planes 24 and 26 may be different. Adjacent or following the intermediate image planes 24 and 26 is a system of relay lenses 28. The relay 28 is preferably a sphero-cylindrical relay. The relay 28 re-images the horizontal and vertical intermediate image planes 24 and 26 onto a reticle 32. The relay 28 may have different magnifications for the horizontal and vertical intermediate image planes 24 and 26. Therefore, a rectangular illumination field is obtained at the reticle 32 of a predetermined dimension.

The entrance pupil which is conjugated with the focal plane of the lens array 20 is imaged by the condenser 22 and a first part of the relay 28 onto a common aperture stop 30 providing Koehler-type illumination in both the sagittal and meridional planes. Thus, the two stage illumination system provides that the area of illumination and the numerical aperture of the illuminating beam can be controlled. An aperture stop 30 is located within the relay 28. The aperture stop 30 is imaged by a second part of the relay 28 at infinity. This produces a telecentric light pattern at the reticle 32. The numerical aperture at the reticle 32 can be the same or different in the horizontal plane and the vertical plane. A horizontal framing blade or width adjustment device 34 is provided at the horizontal image plane 24. The width adjustment device 34 can be adjusted at any predetermined location along the vertical height of the horizontal image plane 24. Because the width adjustment device 34 is located at the horizontal image plane 24, the illumination field is sharp in the width dimension at the wafer.

Accordingly, the rectangular illumination field created at the reticle 32 can be scanned parallel to the width or lateral axis of the rectangular illumination field. This feature means that the image of the reticle 32 sequentially exposes whenever the reticle 32 is larger than the width of the illuminated rectangular field. By adjusting the horizontal or lateral width of the rectangular illumination field, the dose of radiation received by the wafer or wafer exposure can be controlled in relation to a constant velocity scan movement. A vertical delimiter or height adjustment device 36 preferably controls the longitudinal vertical height of the vertical image plane 26. The height adjustment device 36 is located at the vertical image plane 26. In one embodiment, the height adjustment device 36 includes two movable jaws having sharply focused horizontal edges which can be independently positioned to the desired vertical height for the rectangular illumination field. Because the height adjusting devise is located at the vertical image plane 26 the vertical edges of the illumination field are sharply defined at the wafer. An illumination adjustment devise 38 is located between the intermediate horizontal image plane 24 and the intermediate vertical image plane 26. The illumination adjustment devise 38 can be a rectangular slot having a plurality of independently adjustable longitudinal edges. The longitudinal edges being inserted and removed as required to obtain a uniform or desired illumination profile. Because the illumination adjustment devise 38 is not placed in an image plane, the longitudinal edges will not be sharply defined at the wafer plane. This permits slight corrections to the illumination intensity profile or dose making possible the achievement of greater illumination uniformity.

The zoom beam expander $LG_E$ may be comprised of either spherical or cylindrical lenses and allow for collecting changeable partial coherence of light independently from the vertical and horizontal planes. In this embodiment, the present invention permits efficient imaging of different patterns on the reticle 32. In addition, the lens array 20 is changeable and can be either a spherical or cylindrical shape. This allows for obtaining different two-dimensional fields at the reticle 32. Thus, the illumination system of the present invention can be easily adapted for use with different projection optics systems.

The numerical aperture at the reticle 32 is determined by the two-dimensional size of the beam emitted from the zoom beam expander $LG_E$. The numerical aperture at the reticle 32 can be changed without any loss of light. The partial coherence of light is a function of the numerical aperture of the projection optics and the numerical aperture at the reticle 32 of the illumination system. Therefore, by changing the numerical aperture at the reticle 32, the partial coherence of the light can be changed. The changing of the partial coherence of light can be important for the printing of different circuit patterns. If the zoom beam expander $LG_E$ is cylindrical, it is possible to provide different partial coherence in the vertical and horizontal planes. Furthermore, if the lens array 20 is changeable and cylindrical and has different numerical apertures in the vertical and horizontal planes, a two-dimensional independently variable scanning field can be produced at the reticle 32 without any loss of light. Therefore, the illumination system of the present invention is very flexible and has a number of possible applications.

Figure 3:
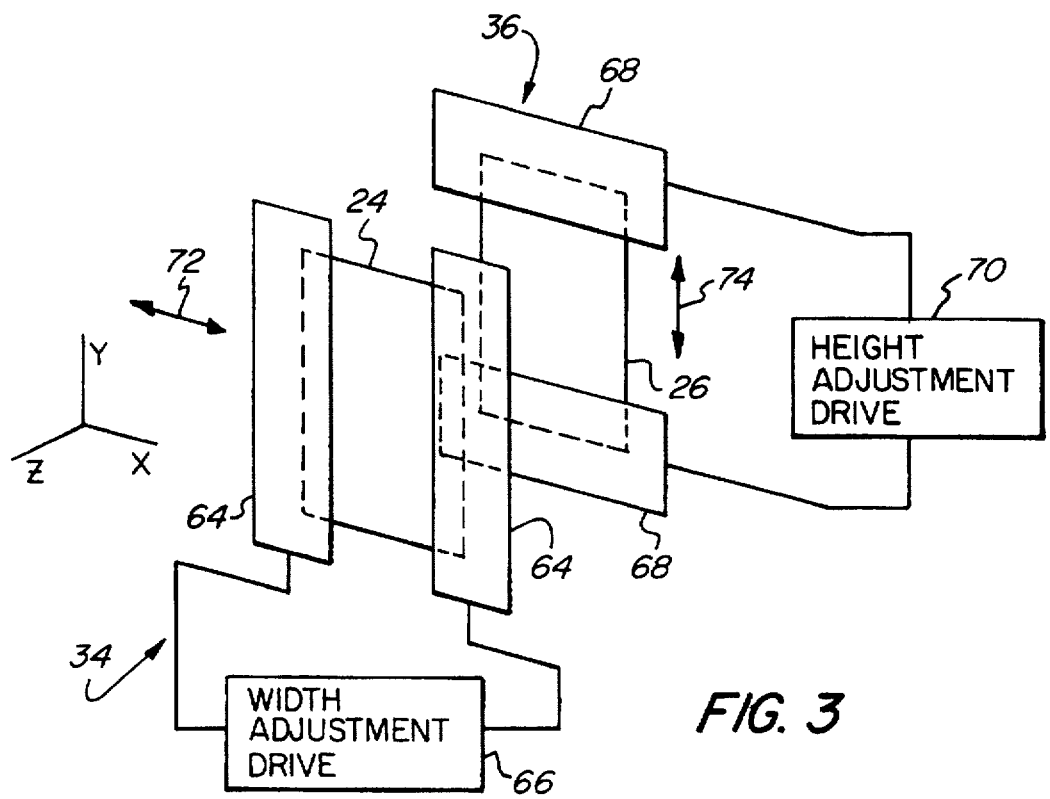
FIG. 3 is a perspective pictorial representation of the spatially separate intermediate horizontal and vertical image planes.

FIG. 3 illustrates more clearly the horizontal intermediate image plane 24 and the vertical intermediate image plane 26. The width of the horizontal intermediate image plane 24 is controlled by width adjusting jaws or blades 64. The blades 64 are driven by a width adjustment drive 66. The width adjustment drive 66 controls the movement of the blades 64 along the x axis in the direction indicated by arrow 72. The height of the vertical intermediate image plane 26 is controlled by height adjusting jaws or blades 68. The blades 68 are driven by a height adjustment drive 70. The height adjustment drive 70 controls the movement of the blades 68 along the y axis in the direction indicated by arrow 74. By independently adjusting the width and height adjusting blades 64 and 68, the rectangular illumination slit or field can be precisely controlled. The spatially separate horizontal and vertical intermediate image planes 24 and 26 greatly facilitates the forming of a predetermined rectangular illumination slit or field at the reticle.

Figure 4:
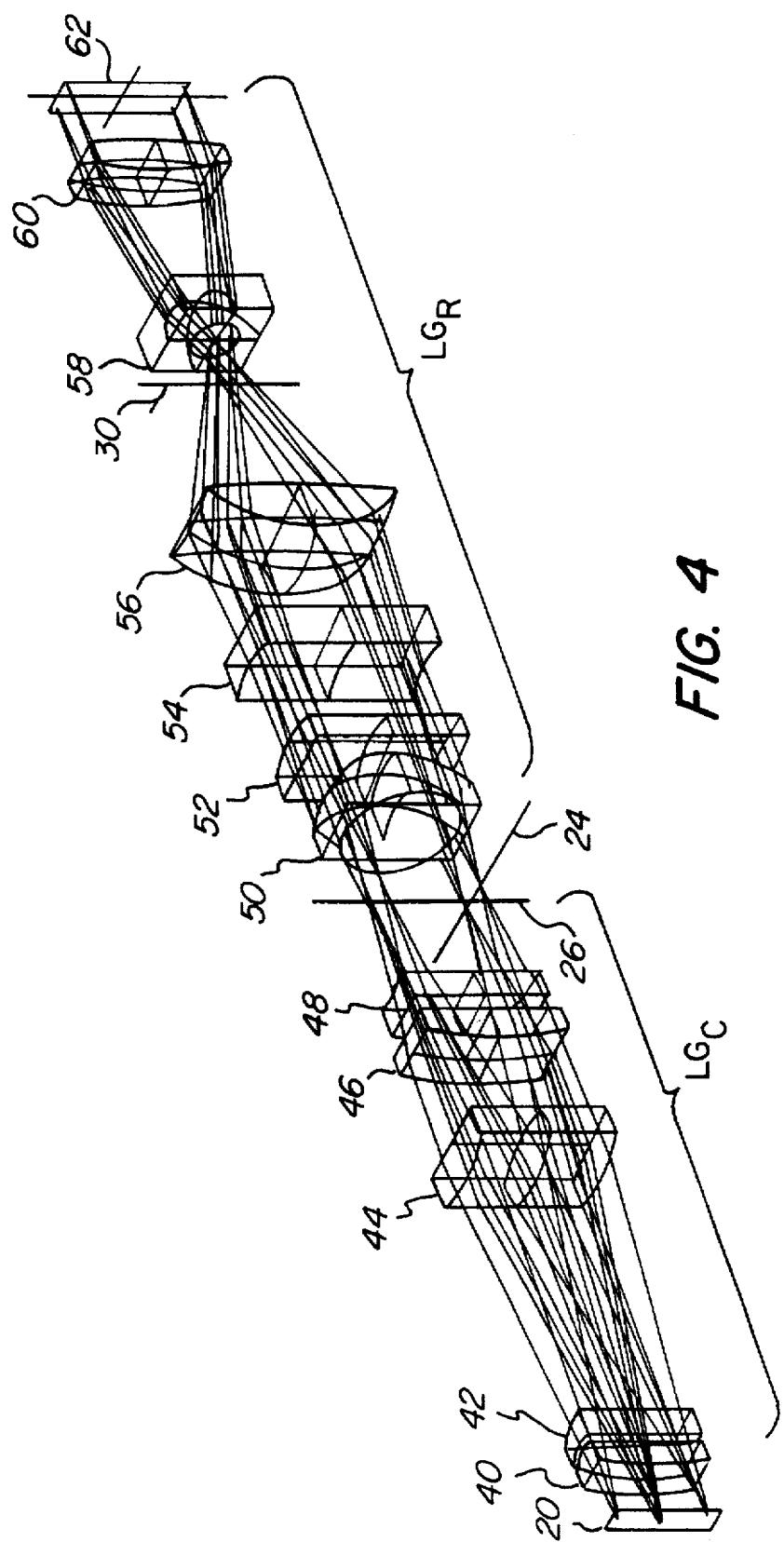
FIG. 4 is a perspective view illustrating a detailed embodiment of an optical illumination system of the present invention.

FIG. 4 represents one embodiment of the present invention that is optimized for an excimer laser source operating at the 248 nanometer wavelength. For convenience, the illumination system is illustrated as beginning at lens array 20. In the illustrated embodiment, the system includes a lens group $LG_C$, a sphero-cylindrical condenser, having five lens elements. In FIG. 4, the lens group $LG_C$ is illustrated as consisting of a spherical lens 40, a cylindrical lens 42, a cylindrical lens with a parabolic surface 44, a spherical lens with a parabolic surface 46, and a cylindrical lens 48. The entrance pupil of the condenser is located at the focal plane of the lens array 20. The horizontal image plane 24 is formed by the positive power spherical lens 40 and a concentric cylindrical lens 42, single positive power lens 44, positive power spherical lens 46, and negative power cylindrical lens 48. A first afocal lens group is made up of lenses 40 and 42. A second negative power lens group is made up of lens 46 and lens 48. The single lens 44 and second negative power lens group create a telephoto system allowing for a short overall length compared to the focal length of the condenser or lens group $LG_C$. The first surface of lens 44 is parabolic creating a telecentric pattern of the chief rays at the horizontal image plane and correcting for spherical aberration. A focal length ratio for the second negative lens group 46, 48 and the single lens 44 between −0.9 and −1 is preferably used to maintain the outside horizontal image plane position between about 0.035 and 0.050 from the length of the condenser $LG_C$, and to correct for Petzval curvature.

The vertical image plane 26 is created by the spherical lenses 40 and 46. The field lens 40 is located near the focal plane of the lens array 20 to avoid introducing significant coma and astigmatism. The lens 46 creates a telecentric light pattern at the vertical image plane 26. For balancing of any axial and off-axial aberrations, lenses 40 and 46 should have a focal length ratio of 1.4 to 1.8. The exit pupils in both of the horizontal and vertical image planes 24 and 26 are located at infinity. The field delimitations at the intermediate image planes 24 and 26 are functions of the numerical aperture of lens array 20 and the effective focal length of the condenser lens group $LG_C$.

Lens group $LG_R$ is preferably a sphero-cylindrical system of relay lenses. Lens group $LG_R$ images the horizontal image plane 24 and the vertical image plane 26 forming a rectangular illumination field 62. The rectangular illumination field 62 illuminates a reticle 32, shown in FIG. 2. Lens group $LG_R$ is illustrated as consisting of six elements: a meniscus spherical lens 50, a cylindrical lens 52, a cylindrical lens 54, a spherical lens 56 with a parabolic surface, a spherical lens 58 with an elliptical surface, and a spherical lens 60. All of the six elements of lens group $LG_R$ contribute to conjugating the horizontal image plane 24 to the rectangular illumination field 62. The two lenses 50 and 52 form a first long focal length correction lens group. The lenses 54 and 56 form a second reverse telephoto lens group. Lens 54 is of a negative power and lens 56 is of a positive power. Lens 58 is a pupil lens and lens 60 is a collimating lens. Lenses 50 and 52 are used for coma and field curvature correction. The reverse telephoto lens group obtains necessary focal length. Lenses 58 and 60 correct residual distortion and astigmatism. Preferably, to correct axial and off-axial aberrations the ratio between the focal lengths of lenses 54 and 56 should be between −1.1 and −1.3. Additionally, the relay horizontal plane magnification should be between 0.7 and 1.2.

In relay lens group $LG_R$, the vertical plane is imaged by a meniscus field lens 50, a positive power lens 56, a pupil lens 58, and a collimating positive power lens 60. The field lens 50 corrects for coma and field curvature. Lens 56 corrects for spherical aberration, coma, and astigmatism by its first parabolic surface and conjugates the entrance pupil with the aperture stop 30. Pupil lens 58 corrects for residual distortion and astigmatism with its elliptical second surface. Collimating lens 11 collimates the light creating a telecentric pattern of the chief rays at the reticle and images the exit pupil at infinity. Preferably, for the best arrangement of the optical powers between powerful lenses 56 and 60, and for the balance between axial and off-axial aberrations, the vertical plane magnification should be between 0.8 and 1.3. Additionally, the ratio between the focal lengths of lens 56 and lens 60 should be between 0.6 and 0.7. The aperture stop 30 is common to both the horizontal and vertical planes and is imaged into infinity by pupil lens 58 and collimating lens 60. The above design permits the overall length of the lens group $LG_C$ and the lens group $LG_R$ to be about 1.4 meters.

Table 1 contains an optical prescription for the condenser and the relay, respectively, the lens group $LG_C$ and the lens group $LG_R$, which is optimized at the 248 nanometer wavelength and at a spectral bandwidth of approximately 10 nanometers such an illumination system would be suitable for an excimer laser source.

TABLE 1

| Surface | RADIUS (mm) | THICKNESS (mm) | Material |
| --- | --- | --- | --- |
| Object | Infinity | Infinity | Air |
| STO | Infinity | 40.500000 | |

TABLE 1-continued

| Surface | RADIUS (mm) | THICKNESS (mm) | Material |
|---|---|---|---|
| 2 | 351.15200 | 20.000000 | Fused silica |
| 3 | Infinity | 10.000000 | |
| 4 | Infinity<br>RDX: −27.40000 | 25.000000 | Fused silica |
| 5 | Infinity<br>RDX: −36.04200 | 238.000000 | |
| 6 | Infinity<br>RDX: 95.20500 | 35.000000<br>K: −1.000000 | Fused silica |
| 7 | Infinity | 65.200000 | |
| 8 | 243.99700<br>K: −1.000000 | 25.000000 | Fused silica |
| 9 | −2411.00000 | 16.000000 | |
| 10 | Infinity | 25.000000 | Fused silica |
| 11 | Infinity<br>RDX: 62.27500 | 20.300000 | |
| 12 | Infinity | 110.000000 | |
| 13 | Infinity | 50.000000 | |
| 14 | −54.65800 | 35.000000 | Fused silica |
| 15 | −70.26600 | 5.000000 | |
| 16 | Infinity | 25.000000 | Fused silica |
| 17 | Infinity<br>RDX: −132.01500 | 74.600000 | |
| 18 | Infinity<br>RDX: −132.01500 | 30.00000 | Fused silica |
| 19 | Infinity | 64.800000 | |
| 20 | 69.2550.0<br>K: −1.000000 | 50.000000 | Fused silica |
| 21 | −768.18400 | 149.712719 | |
| 22 | Infinity | 34.980661 | |
| 23 | −24.87300 | 30.000000 | Fused silica |
| 24 | −33.26700<br>K: −0.234800 | 106.44288 | |
| 25 | 169.63100 | 30.000000 | Fused silica |
| 26 | −379.33100 | 64.449195 | |
| Image | Infinity | 0.000000 | Air |

Table 2 contains an optical prescription for the condenser and the relay, respectively, the lens group $LG_C$ and the lens group $LG_R$, which is optimized at 193 nanometers wavelength.

TABLE 2

| Surface | RADIUS (mm) | THICKNESS (mm) | Material |
|---|---|---|---|
| Object | Infinity | Infinity | Air |
| STO | Infinity | 40.500000 | |
| 2 | 358.03900 | 20.000000 | Fused silica |
| 3 | Infinity | 10.000000 | |
| 4 | Infinity<br>RDX: −24.56200 | 25.000000 | Fused silica |
| 5 | Infinity<br>RDX: −35.81400 | 244.500000 | |
| 6 | Infinity<br>RDX: 98.35900 | 35.000000<br>K: −1.000000 | Fused silica |
| 7 | Infinity | 105.200000 | |
| 8 | 258.68800<br>K: | 25.000000<br>−1.000000 | Fused silica |
| 9 | Infinity | 1.000000 | |
| 10 | Infinity | 25.000000 | Fused silica |
| 11 | Infinity<br>RDX: 61.17100 | 118.734469 | |
| 12 | Infinity | 53.900000 | |
| 13 | −57.12900 | 35.000000 | Fused silica |
| 14 | −74.48600 | 5.000000 | |
| 15 | Infinity<br>RDX: 259.94900 | 25.000000 | Fused silica |
| 16 | Infinity | 107.900000 | |
| 17 | Infinity | 30.000000 | Fused silica |
| 18 | Infinity<br>RDX: 259.94900 | 5.000000 | |
| 19 | 90.59600<br>K: −1.000000 | 50.000000 | Fused silica |
| 20 | −930.04800 | 143.664000 | |

TABLE 2-continued

| Surface | RADIUS (mm) | THICKNESS (mm) | Material |
|---|---|---|---|
| 21 | Infinity | 29.140000 | |
| 22 | −24.75300 | 30.000000 | Fused silica |
| 23 | −34.06900<br>K: −0.214703 | 92.700000 | |
| 24 | 137.65600 | 30.000000 | Fused silica |
| 25 | −606.77900 | 72.695000 | |
| Image | Infinity | 0.000000 | Air |

In the Tables, RDX is the radius in the sagittal plane, and K is the surface profile second order coefficient.

From the above, it should be readily apparent that the present invention advances illumination systems as used in photolithography and semiconductor manufacturing. The present invention is flexible and adaptable to different photolithography systems and provides a uniform rectangular illumination that is variable in width and height without loss of light. Additionally, the numerical aperture can be changed to facilitate use with different projection optics and makes possible changing the partial coherence of light illumination without loss of light. Although the preferred embodiments have been illustrated and described, it will be apparent to those skilled in the art that various modifications may be made without departing from the spirit and scope of this invention as set forth in the claims.

What is claimed is:

1. An illumination system for photolithography, comprising:
   a beam expander;
   a lens array following the beam expander;
   a condenser following the lens array, the condenser having a horizontal image plane and a vertical image plane at different spatial locations; and
   a relay following the condenser, whereby light entering the beam expander is directed to the lens array, imaged in two spatially separate planes by the condenser, and re-imaged in a single plane at a reticle by the relay.

2. An illumination system as in claim 1, further comprising an illumination source.

3. An illumination system as in claim 2, wherein the illumination source is a laser.

4. An illumination system as in claim 3, wherein the laser is an excimer laser.

5. An illumination system as in claim 1, wherein the beam expander is a zoom beam expander.

6. An illumination system as in claim 1, wherein the beam expander is a spherical zoom beam expander.

7. An illumination system as in claim 1, wherein the beam expander is a cylindrical zoom beam expander.

8. An illumination system as in claim 1, wherein the lens array is a microlens array.

9. An illumination system as in claim 1, wherein the lens array is a diffraction grating array.

10. An illumination system as in claim 1, wherein the lens array is a binary array.

11. An illumination system as in claim 1, wherein the lens array is spherical.

12. An illumination system as in claim 1, wherein the lens array is cylindrical.

13. An illumination system as in claim 1, wherein the condenser is comprised of spherical and cylindrical lenses.

14. An illumination system as in claim 1, wherein the relay is comprised of spherical and cylindrical lenses.

15. An illumination system as in claim 1, further comprising:

width adjusting means, located at the horizontal image plane, for adjusting the width of an illuminated field at the reticle; and height adjusting means, located at the vertical image plane, for adjusting the height of the illuminated field at the reticle.

16. An illumination system as in claim 15, further comprising an illumination adjustment means, located near an image plane, for adjusting the illumination dose.

17. An illumination system for photolithography, comprising:

a zoom beam expander;

a lens array following the zoom beam expander;

a condenser lens group following the lens array, the condenser lens group including from one end to the other a first spherical lens, a first cylindrical lens, a second cylindrical lens with a parabolic surface, a second spherical lens with a parabolic surface, and a third cylindrical lens, the condenser lens group having a horizontal image plane and a vertical image plane at different spatial locations; and a relay lens group following the condenser lens group, the relay lens group including from one end to the other a third spherical lens, a fourth cylindrical lens, a fifth cylindrical lens, a fourth spherical lens with a parabolic surface, a fifth spherical lens with an elliptical surface, and a sixth spherical lens, whereby light entering the zoom beam expander is directed to the lens array and imaged in two spatially separate planes by the condenser, and re-imaged in a single plane at a reticle by the relay.

18. An illumination system as in claim 17, further comprising:

width adjusting means, located at the horizontal image plane, for adjusting the width of an illuminated field at the reticle; and height adjusting means located, located at the vertical image plane, for adjusting the height of the illuminated field at the reticle.

19. An illumination system for photolithography, comprising:

a zoom beam expander;

a lens array following the zoom beam expander; and a condenser and relay lens group following the lens array constructed according to the optical prescription of the following Table 1

TABLE 1

| Surface | RADIUS (mm) | THICKNESS (mm) | Material |
|---|---|---|---|
| Object | Infinity | Infinity | Air |
| STO | Infinity | 40.500000 | |
| 2 | 351.15200 | 20.000000 | Fused silica |
| 3 | Infinity | 10.000000 | |
| 4 | Infinity | 25.000000 | Fused silica |
| | RDX: −27.40000 | | |
| 5 | Infinity | 238.000000 | |
| | RDX: −38.04200 | | |
| 6 | Infinity | 35.000000 | Fused silica |
| | RDX: 95.20500 | K: −1.000000 | |
| 7 | Infinity | 85.200000 | |
| 8 | 243.99700 | 25.000000 | Fused silica |
| | K: −1.000000 | | |
| 9 | −2411.00000 | 16.000000 | |
| 10 | Infinity | 25.000000 | Fused silica |
| 11 | Infinity | 20.300000 | |
| | RDX: 62.27500 | | |

TABLE 1-continued

| Surface | RADIUS (mm) | THICKNESS (mm) | Material |
|---|---|---|---|
| 12 | Infinity | 110.000000 | |
| 13 | Infinity | 50.000000 | |
| 14 | −54.65800 | 35.000000 | Fused silica |
| 15 | −70.28600 | 5.000000 | |
| 16 | Infinity | 25.000000 | Fused silica |
| 17 | Infinity | 74.600000 | |
| | RDX: −132.01500 | | |
| 18 | Infinity | 30.00000 | Fused silica |
| | RDX: −132.01500 | | |
| 19 | Infinity | 64.800000 | |
| 20 | 89.25500 | 50.000000 | Fused silica |
| | K: −1.000000 | | |
| 21 | −768.18400 | 149.712719 | |
| 22 | Infinity | 34.980661 | |
| 23 | −24.87300 | 30.000000 | Fused silica |
| 24 | −33.26700 | 106.44288 | |
| | K: −0.234800 | | |
| 25 | 169.63100 | 30.000000 | Fused silica |
| 26 | −379.33100 | 64.449195 | |
| Image | Infinity | 0.000000 | Air |

20. An illumination system as in claim 19, further comprising a laser illumination source.

21. An illumination system for photolithography, comprising:

a zoom beam expander;

a lens array following the zoom beam expander; and a condenser and relay lens group following the lens array constructed according to the optical prescription of the following Table 2

TABLE 2

| Surface | RADIUS (mm) | THICKNESS (mm) | Material |
|---|---|---|---|
| Object | Infinity | Infinity | Air |
| STO | Infinity | 40.500000 | |
| 2 | 358.03900 | 20.000000 | Fused silica |
| 3 | Infinity | 10.000000 | |
| 4 | Infinity | 25.000000 | Fused silica |
| | RDX: −24.56200 | | |
| 5 | Infinity | 244.500000 | |
| | RDX: −35.81400 | | |
| 6 | Infinity | 35.000000 | Fused silica |
| | RDX: 98.35900 | K: −1.000000 | |
| 7 | Infinity | 105.200000 | |
| 8 | 258.68800 | 25.000000 | Fused silica |
| | K: −1.000000 | | |
| 9 | Infinity | 1.000000 | |
| 10 | Infinity | 25.000000 | Fused silica |
| 11 | Infinity | 118.734469 | |
| | RDX: 61.17100 | | |
| 12 | Infinity | 53.900000 | |
| 13 | −57.12900 | 35.000000 | Fused silica |
| 14 | −74.48600 | 5.000000 | |
| 15 | Infinity | 25.000000 | Fused silica |
| | RDX: 259.94900 | | |
| 16 | Infinity | 107.900000 | |
| 17 | Infinity | 30.000000 | Fused silica |
| 18 | Infinity | 5.000000 | |
| | RDX: 259.94900 | | |
| 19 | 90.59600 | 50.000000 | Fused silica |
| | K: −1.000000 | | |
| 20 | −930.04800 | 143.664000 | |
| 21 | Infinity | 29.140000 | |
| 22 | −24.75300 | 30.000000 | Fused silica |
| 23 | −34.06900 | 82.700000 | |
| | K: −0.214703 | | |
| 24 | 137.65800 | 30.000000 | Fused silica |
| 25 | −608.77900 | 72.695000 | |
| Image | Infinity | 0.000000 | Air |

22. An illumination system as in claim 21, further comprising a laser illumination source.

23. An illumination system for photolithography, comprising:

an illumination source;

a beam expander following said illumination source;

a lens array following said beam expander, said beam expander and said lens array providing a predetermined first numerical aperture in a horizontal plane and a second numerical aperture in a vertical plane;

a condenser following said lens array, said condenser having a horizontal image plane and a vertical image plane, the vertical image plane being spatially separate from the horizontal image plane;

a relay following said condenser, said relay conjugating the horizontal image plane and the vertical image plane to a single illumination plane at a reticle, said relay having a first magnification in a horizontal plane and a second magnification in a vertical plane.

24. An illumination system as in claim 23 wherein:

the first magnification and the second magnification are different.

25. An illumination system as in claim 23 wherein:

the first numerical aperture and the second numerical aperture are different.

26. An illumination system as in claim 23 further comprising:

width adjusting means, associated with said horizontal image plane, for adjusting the width of said horizontal image plane; and height adjusting means, associated with said vertical image plane, for adjusting the height of said horizontal image plane, whereby a predetermined rectangular illumination field is formed at the reticle.

27. An illumination system as in claim 23 wherein:

said first magnification ranges between 0.7 and 1.2; and said second magnification ranges between 0.8 and 1.3.

28. An illumination system for photolithography, comprising:

a zoom beam expander;

a lens array following the zoom beam expander;

a condenser lens group following the lens array, said condenser lens group including a plurality of cylindrical lenses and having a horizontal image plane and a vertical image plane formed at different spatial locations along an optical axis; and a relay lens group following the condenser lens group, said relay lens group having a plurality of cylindrical lenses and re-imaging the horizontal image plane and the vertical image plane of said condenser lens group onto a single image plane at a reticle.

29. An illumination system for photolithography, comprising:

an illumination source;

a beam expander following said illumination source;

a lens array following said beam expander, said beam expander and said lens array providing a first numerical aperture in a horizontal plane and a second numerical aperture in a vertical plane, said first numerical aperture and said second numerical aperture being different;

a condenser following said lens array, said condenser having a horizontal image plane and a vertical image plane;

a relay following said condenser, said relay having a first magnification in a horizontal plane and a second magnification in a vertical plane, said first magnification and said second magnification being different, whereby illumination in the horizontal and vertical image plane may be independently changed without loss of light.

* * * * *